United States Patent [19]

Moonen et al.

[11] Patent Number: 5,317,262

[45] Date of Patent: May 31, 1994

[54] SINGLE SHOT MAGNETIC RESONANCE METHOD TO MEASURE DIFFUSION, FLOW AND/OR MOTION

[75] Inventors: Chrit T. W. Moonen, Silver Spring, Md.; Peter van Gelderen, Delft, Netherlands

[73] Assignee: The United States of America as represented by the Department of Health and Human Services, Washington, D.C.

[21] Appl. No.: 926,010

[22] Filed: Aug. 5, 1992

[51] Int. Cl.[5] .............................................. G01V 3/00
[52] U.S. Cl. .................................... 324/309; 324/307; 324/306
[58] Field of Search ............... 324/306, 300, 307, 309, 324/312, 314, 316

[56] References Cited

U.S. PATENT DOCUMENTS

| | | |
|---|---|---|
| 4,985,677 | 1/1991 | Pauly . |
| 5,025,216 | 1/1991 | Pauly et al. . |
| 5,043,665 | 8/1991 | Kuhara et al. ........................ 324/309 |
| 5,070,876 | 12/1991 | Wright . |
| 5,162,730 | 11/1992 | Schmitt et al. ........................ 324/309 |

OTHER PUBLICATIONS

Singer, J. R., "Blood Flow Rates by Nuclear Magnetic Resonance measurements," *Science*, Dec. 1959, pp. 1652–1653.
Turner, R., et al., "Echo-Planar Imaging of Intravoxel Incoherent Motion," *Radiol.* 177:407–414 (1990) (no month).
Karlicek, R. F. and Lowe, I. J., "A Modified Pulsed Gradient Technique for Measuring Diffusion in the Presence of Large Background Gradients," *J. Magnetic Resonance* 37:75–91 (1980) (no month).
Berliner, L. J. and Fujii, H., "Magnetic Resonance Imaging of Biological Specimens by Electron Paramagnetic Resonance of Nitroxide Spin Labels," *Science* 227:517–518 (1985) (no month).
Brewer, R. G. and Hahn, E. L., "Atomic Memory," *Sci. Amer.*, Dec. 1984, pp. 50–57.

Lederman, L. M., "The Value of Fundamental Science," *Sci. Amer.*, vol. 251, Nov. 1984, pp. 40–47.
Budinger, T. F. and Lauterbur, P. C., "Nuclear Magnetic Resonance Technology for Medical Studies," *Science* 226:288–298 (1984) (no month).
Li, L. and Sotak, C. H., "Diffusion Measurements by Pulsed Field-Gradient Multiple Spin Echoes," *J. Magnetic Resonance* 92:411–420 (1991) (no month).
Dumoulin, C. L., et al., "Three-Dimensional Phase Contrast Angiography," *Magnetic Resonance Med.* 9:139–149 (1989) (no month).
Hrovat, M. I., et al., "An Alternating Pulsed Gradient Apparatus for NMR Self-Diffusion Measurements," *J. Magnetic Resonance* 49:411–424 (1982) (no month).
Stejskal, E. O. and Tanner, J. E., "Spin Diffusion Measurements: Spin Echoes in the Presence of a Time-Dependent Field Gradient," *J. Chem. Phys.* 42:288–292 (1963) (no month).
Moseley, M. E., et al., "Diffusion-weighted MR Imaging of Anisotropic Water Diffusion in Cat Central Nervous System," *Radiol.* 176:439–445 (1990) (no month).

*Primary Examiner*—Louis Arana
*Attorney, Agent, or Firm*—Townsend and Townsend Khourie and Crew

[57] ABSTRACT

A method of obtaining an attenuation curve, and corresponding diffusion constant, from a single-shot procedure. In contrast to the conventional pulsed field-gradient spin echo (PGSE) procedures used to determine the diffusion attenuation curve of a body undergoing magnetic resonance imaging, the method uses a single-shot procedure. The procedure uses application of a single shot pulse sequence to initiate a spin-echo procedure. This procedure creates a number of gradient recalled echoes by alternating the diffusion gradient. Each subsequent gradient-recalled echo is attenuated by an additional pair of gradient pulses. This successive attenuation by the gradient pulses allows the diffusional attenuation curve to be determined accurately in a single procedure. Ratios of time symmetric echo pulses yield a value proportional to the diffusion constant.

10 Claims, 3 Drawing Sheets

SINGLE SHOT MAGNETIC RESONANCE METHOD TO MEASURE DIFFUSION, FLOW AND/OR MOTION

BACKGROUND OF THE INVENTION

The present invention relates generally to magnetic resonance imaging (MRI) and more specifically, the present invention relates to a single shot magnetic resonance method and apparatus for determining diffusion, flow or motion in a body.

Nuclear magnetic resonance (NMR) imaging, also called magnetic resonance imaging (MRI), is a nondestructive method for the analysis of materials and represents a relatively new approach to medical imaging. MRI is completely non-invasive and does not involve ionizing radiation. In very general terms, nuclear magnetic moments are excited at specific spin precession frequencies that are proportional to a local magnetic field. Radio-frequency signals resulting from the precession of these spins are received using pickup coils. By manipulating the magnetic fields, an array of signals is provided for different regions of the volume. These signals are combined to produce a volumetric image of the nuclear spin density of the body being imaged.

Briefly, a strong static magnetic field is employed to line up atoms whose nuclei have an odd number of protons and/or neutrons, that is, have a net spin angular momentum and a magnetic dipole moment. A second RF magnetic field, applied as a single pulse transverse to the first, is then used to pump energy into these nuclei, flipping them over, for example to 90° or 180°. After excitation, the nuclei gradually return to alignment with the static field and give up energy in the form of weak but detectable free induction decay (FID). These FID signals are used by a computer to produce images.

The excitation frequency, and the FID frequency, is defined by the Larmor relationship (equation 1) that states that the angular frequency, $\omega_0$, of the precession of the nuclei is the product of the magnetic field, $B_0$, and the gyromagnetic ratio, $\gamma$, a fundamental physical constant for each nuclear species:

$$\omega_0 = B_0 \gamma \quad (1)$$

Accordingly, by superimposing a linear gradient field, $B_z = z \cdot G_z$, on the static uniform field, $B_0$, which defines the Z-axis, for example, nuclei in a selected X-Y planes can be excited by proper choice of the frequency spectrum of the transverse excitation field applied along the X or Y axis. Similarly, a gradient field can be applied in the X-Y plane during detection of the FID signals to spatially localize the FID signals in the plane. The angle of nuclei spin flip in response to an RF pulse excitation is proportional to the integral of the pulse over time.

A spin echo technique has been employed in obtaining magnetic resonance signals from a body in a non-homogenous magnetic field. After nuclear spins are tilted and have been processed for a period T, a 180° refocussing RF field is applied to flip the nuclear spins 180°. After a period T, the nuclear spins will refocus, at which time the magnetic resonance signals are detected.

Diffusional processes reflect closely molecular and structural organization. This is one reason behind the rapidly growing interest in use of NMR to measure diffusion in solution, in gases, in solid state, and in vivo. Diffusion procedures are becoming an important class of in vivo procedures, especially as it has been demonstrated that regional differences in diffusion are related to brain damage in acute stroke models. M. E. Moseley, et al., Radiology, 176, 439 (1990). A conventional pulsed field-gradient spin echo (PGSE) diffusion procedure uses a pair of gradient pulses to render a signal sensitive to spin displacement. One conventional method repeats the basic procedure while successively increasing diffusional weighting. The increased diffusional weighting results from repeating the basic procedure n times, with each procedure employing an increased gradient amplitude. Increasing the gradient amplitude creates a spread in phase, causing a decrease in echo amplitude S. S, a function of the gradient amplitude, can be fitted to an equation 2 developed by Stejskal and Tanner:

$$S(G) = S(G=0) e^{-\gamma^2 G^2 (2\delta)^2 (\Delta - 2\delta/3) D} \quad (2)$$

where G is the gradient amplitude, $\gamma$ is the gyromagnetic ratio, D is the diffusion constant, $\Delta$ is an interval between leading edges of diffusion sensitizing gradient pulses, and $\delta$ is half the duration of each gradient pulse. A difficulty with the conventional system for measurement of diffusion is that resolution or measurement of the diffusion constant D is hampered by bulk motions of the body, and the time-resolution is undesirable because of the procedure's repetition. R. Turner, et al., Radiology, 177, 407 (1990) and C. T. W. Moonen, et al., Science, 250, 53 (1990), both hereby expressly incorporated by reference for all purposes.

The present invention is directed to providing improved time resolution and reduced susceptibility due to bulk motions of the body. The present invention provides a single shot magnetic resonance method and apparatus for measuring diffusion, flow or motion.

SUMMARY OF THE INVENTION

The present invention provides apparatus and method for simply and efficiently measuring diffusion, flow or motion using a single shot magnetic resonance method or apparatus. A feature of the present invention is its ability to use a single procedure to determine a diffusional attenuation curve of a body undergoing imaging.

According to one aspect of the invention, a diffusion attenuation curve is measurable with a single procedure, with or without a static field gradient. A radio-frequency (RF) is applied to a body to tip nuclear spins of the body. A first gradient pulse is next applied to the body, and followed by a second RF excitation pulse. A series of consecutive alternating-phase gradient pulses create a series of gradient-recalled echoes. The magnetic resonance signals, the echoes, are detected and measured. By ratioing a pair of the echoes symmetric with respect to the spin echo, the diffusion attenuation curve for the sample is produced from the single procedure.

Reference to the remaining portions of the specification and drawing will realize further understanding of the nature, advantages and features of the present invention.

DESCRIPTION OF THE PREFERRED EMBODIMENTS

Figure 1A:
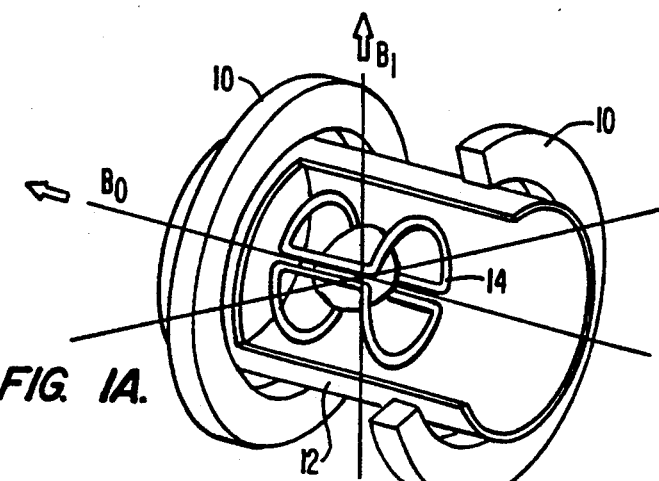
FIGS. 1A-1D illustrate the arrangement of conventional MRI apparatus and magnetic fields generated therein.
Figures 1B, 1C, 1D:
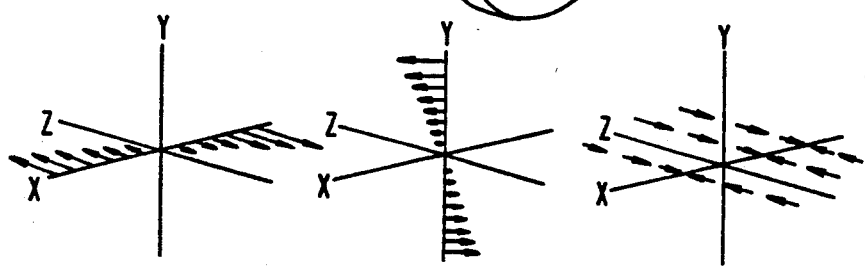

FIGS. 1A-1D illustrate the arrangement of conventional MRI apparatus and magnetic fields generated therein. FIG. 1A is a perspective view partially in section illustrating coil apparatus in a magnetic resonance imaging (MRI) system. FIGS. 1B-1D illustrate field gradients that can be produced in the apparatus shown in FIG. 1A. This apparatus is further discussed by Hinshaw and Lent, "An Introduction to NMR Imaging: From the Bloch Equation to the Imaging Equation,: Proceedings of the IEEE, Vol. 71, No. 3, March 1983, pp. 338-350, hereby expressly incorporated by reference for all purposes. Briefly, the uniform static field $B_0$ is generated by a magnet, shown here as a coil pair 10. A gradient field $G_x$ is generated by a complex gradient coil set wound on cylinder 12. An RF field $B_1$ is generated by a saddle coil 14. A body undergoing imaging is positioned along the Z axis within the saddle coil 14.

In FIG. 1B an X gradient field is shown that is parallel to the static field $B_0$ and varies linearly with distance along the X axis, but does not vary with distance along the Y or Z axes. FIGS. 1C and 1D are similar representations of the Y gradient and Z gradient fields, respectively.

Figure 2:
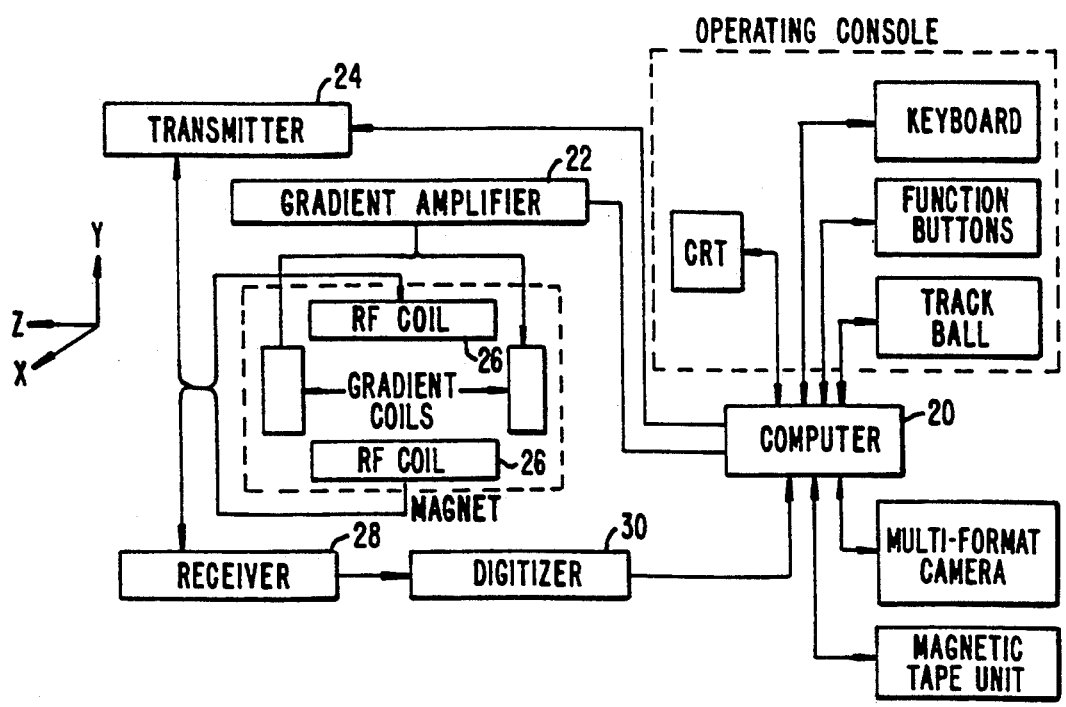
FIG. 2 is a functional block diagram of an MRI apparatus.

FIG. 2 is a functional block diagram of an MRI apparatus. This apparatus is similar to that disclosed in "NMR—A Perspective on Imaging," General Electric Company, 1982, hereby expressly incorporated by reference for all purposes. A computer 20 is programmed to control the operation of the MRI apparatus and process free induction decay (FID) signals detected therefrom. The gradient field is energized by a gradient amplifier 22, and the RF coils for impressing an RF magnetic moment at the Larmor frequency is controlled by a transmitter 24 and a set of RF coils 26. After the selected nuclei have been flipped, the RF coils 26 are employed to detect the FID signal that is passed to a receiver 28 and thereafter through a digitizer 30 for processing by the computer 20.

Figure 3:
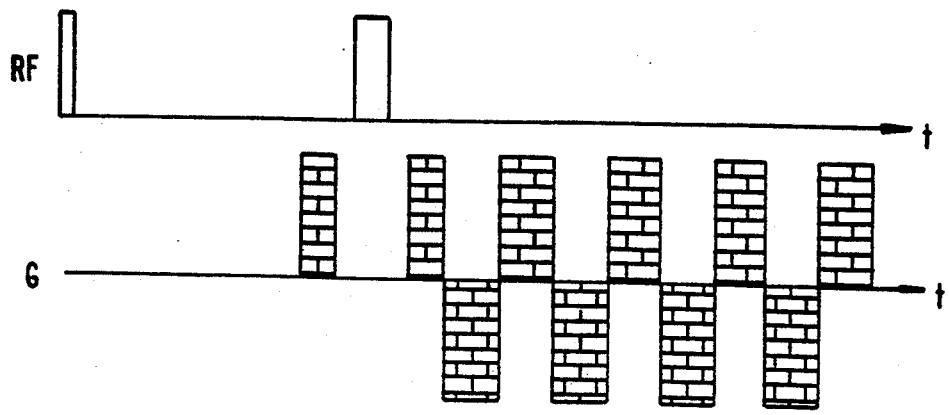
FIG. 3 is a graphic of a preferred pulse sequence for single-shot diffusion.

FIG. 3 is a graphic of a preferred pulse sequence for single-shot diffusion. The preferred pulse sequence is part of a spin-echo procedure during which a number of gradient echoes is created by altering a diffusion gradient during imaging. In FIG. 3, two plots are shown; one plot illustrates the applied RF pulses and another plot illustrates the applied gradient pulses. Initiation of the procedure results from application of a first RF pulse to tip nuclear moments. A subsequent gradient pulse, followed by a second RF pulse creates a gradient echo detectable by the imaging apparatus. The second RF pulse is followed by a series of consecutive alternating diffusion gradients. These series of diffusion gradients create in turn additional gradient recalled echoes. Each subsequent gradient recalled echo is attenuated by an additional pair of gradient pulses. This attenuation of the echoes allows a diffusional attenuation curve to be determined accurately by the single procedure. The single procedure includes the single, one-time application of the pulse sequence of FIG. 3 and the subsequent detection of the resulting gradient recalled echoes.

Stejskal and Tanner provide a theoretical framework for spin diffusion measurements. E. O. Stejskal and J. E. Tanner, "Spin Diffusion Measurements: Spin Echoes in the Presence of a Time-Dependent Field Gradient," J. Chem. Physics. Vol. 42, No. 1, pp. 288-292 (January 1965), hereby expressly incorporated by reference for all purposes. Using equation 2 above for the pulse sequence shown in FIG. 3, the attenuation of the gradient echoes is given by equation 3 below, when there are no static $B_0$ inhomogeneities:

$$S_n(G) = S_n(G=0) e^{-\gamma^2 G^2 D 2n(\delta^3/3)} \quad (3)$$

where $S_n$ is the signal amplitude of the n-th gradient-recalled echo, G is the gradient pulse's amplitude, $\gamma$ is the gyromagnetic ratio, D is the diffusion constant and $\delta$ is one-half each gradient pulse's duration.

If a static field gradient ($B_0$ inhomogeneity) of amplitude $G_s$ is present, the echo attenuation becomes different for even and uneven echoes because of different effects of cross terms for $G_sG$. For uneven echoes, the echo attenuation can be described as:

$$S_n(G_s,G) = S_n(G_s=0,G) e^{-\gamma^2 G^2 D 2n(\delta^3/3)} e^{-\gamma^2 G G_s D(-2\tau\delta^2+(4/3-2n)\delta^3)} \quad (4)$$

where $\tau$ is the echo time. For even echoes, the attenuation is described as:

$$S_n(G_s,G) = S_n(G_s=0,G) e^{-\gamma^2 G^2 D 2n(\delta^3/3)} e^{-\gamma^2 G G_s D(2n-2/3)\delta^3} \quad (5)$$

The importance of the cross-terms for large static inhomogeneities has been realized previously. Multiple refocussing RF pulses may be used to decrease the role of the cross-terms. However, for many cases, $G_s$ is much less than G, allowing the cross-terms to be neglected.

PROCEDURAL RESULTS

The application of the alternating gradient pulses to create a series of gradient-recalled echoes from which one can produce a diffusion attenuation curve in accordance with the invention and as described above is interesting from a theoretical viewpoint. To show that the method and apparatus is useful practically, the method was implemented at room temperature using a standard 10 mm NMR tube. The tube was filled with lightly doped water. A 4.7 T Oxford Instruments magnet was used, equipped with a Doty shielded gradient set and a home-built spectrometer.

Figure 4A:
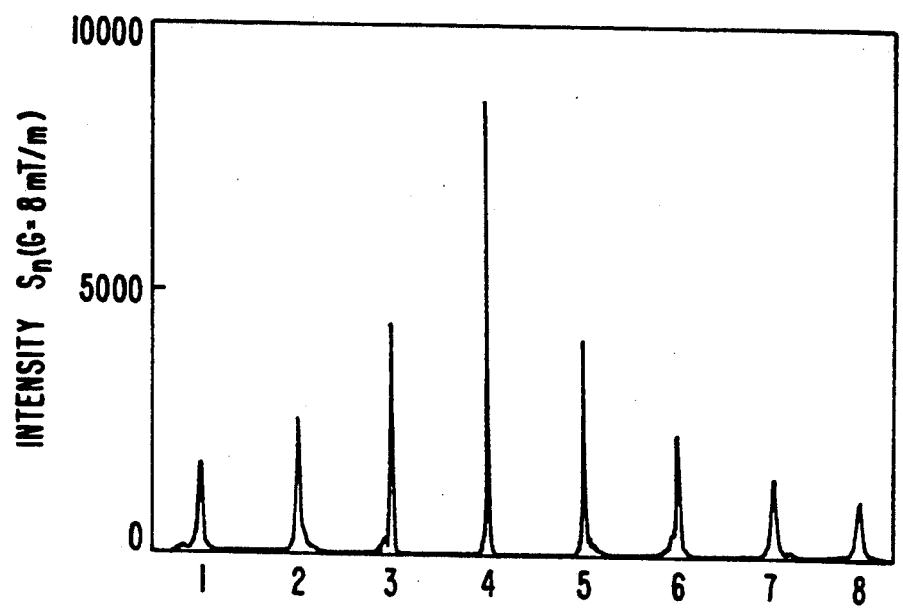
FIGS. 4A-4B are graphs of a series of gradient-recalled echoes obtained procedurally.
Figure 4B:
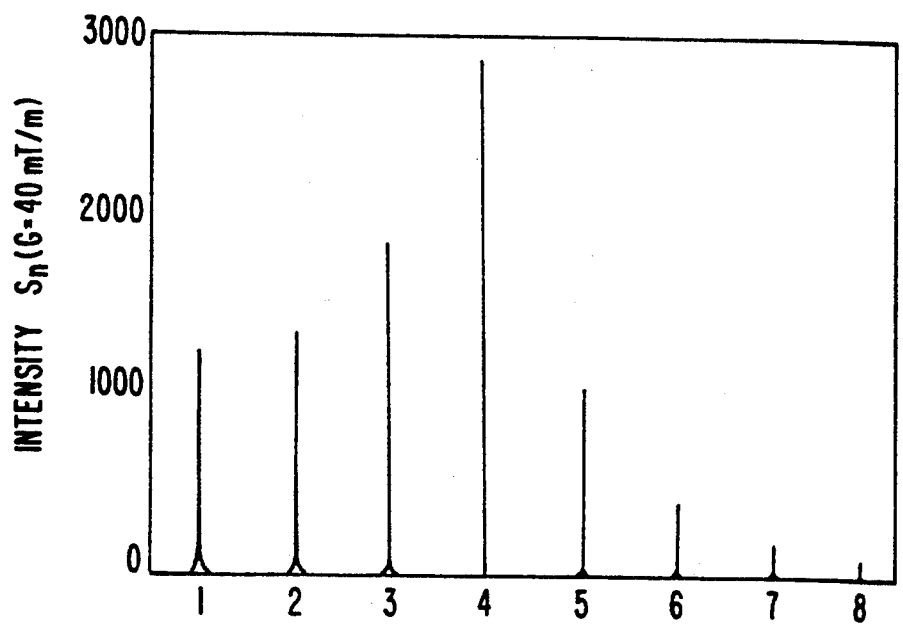

FIG. 4A and 4B are graphs of a series of gradient-recalled echoes obtained procedurally. Application of the pulse sequence shown in FIG. 3 with a pulse gradient amplitude of 8 mT/m produced the echoes of FIG. 4A, while use of a pulse gradient amplitude of 40 mT/m produced the echoes of FIG. 4B. The data of FIGS. 4A and 4B show the absolute signal intensity from the two procedures. Echo time was 82 ms and the gradient echo-time ($2\delta$) was 24 ms. FIG. 4B indicate the effects of the gradient while diffusional attenuation is negligible in FIG. 4A. In FIG. 4A, $S_{n=4}$ corresponds to the spin echo. The diffusional attenuation is seen to be negligible in FIG. 4A as the $S_n$'s that are symmetric in time relative to $S_{n=4}$ have the same amplitude. Ratioing corresponding peak amplitudes, as shown in the equation below, from the two procedures producing outputs shown in FIG. 4A and FIG. 4B, fit well to equation 3.

$$\ln\left(\frac{S_n(G=40)}{S_n(G=8)}\right) = -\gamma^2 G^2 D 2n \left(\frac{\delta^3}{3}\right) \quad (6)$$

Solving for D, the diffusion constant from the equation 6 above produces:

$$D = \frac{\ln\left(\frac{S_n(G=40)}{S_n(G=8)}\right)}{-\gamma^2(G=40)^2 2n\left(\frac{\delta^3}{3}\right)} \quad (7)$$

Figure 5:
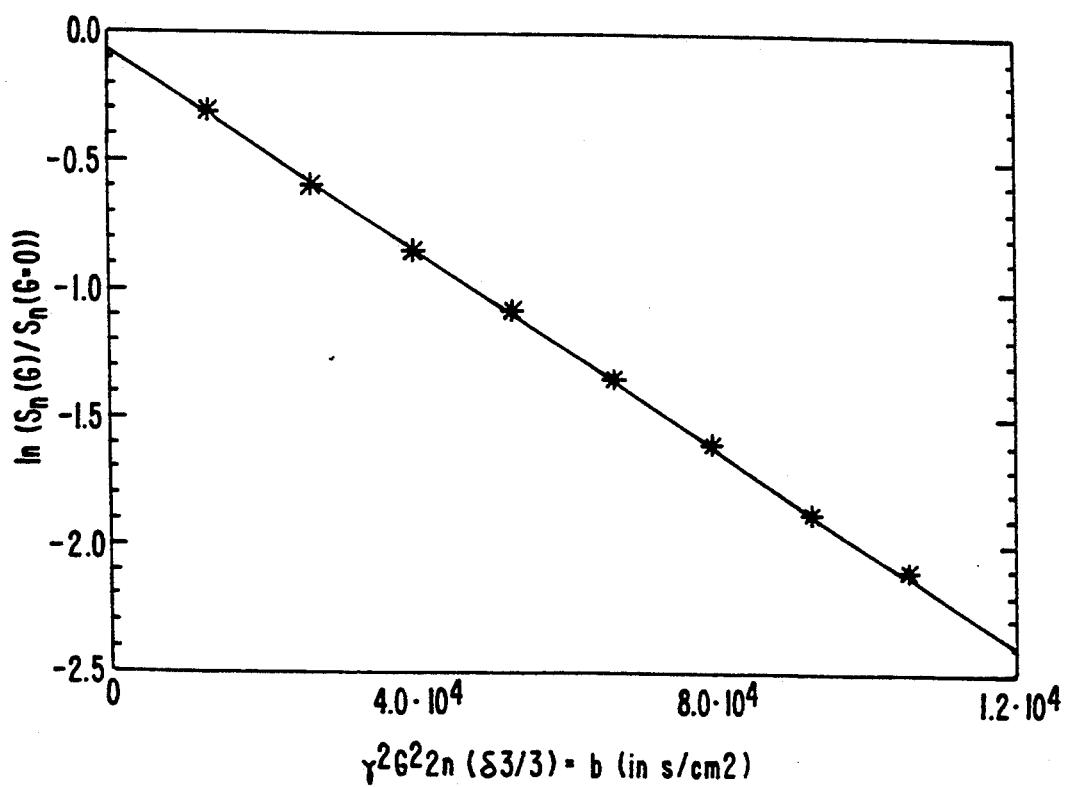
FIG. 5 is a plot of data from FIGS. 4A and 4B fitted according to Equation 7.

FIG. 5 is a plot of data from FIGS. 4A and 4B fitted according to Equation 7. That is, the values of $G=8$, FIG. 4A, provide the values of $S_n(G=0)$ for use in equation 3 above. From the plot of FIG. 5, D was determined to be about $1.96 \times 10^{-9}$ m²/s.

Significantly, D is also determinable from FIG. 4B only, without requiring the measurement of $S_n(G=0)$. A ratio of a corresponding ones of a pair of gradient echoes symmetric in time with respect to the spin echo, e.g. echoes 1 and 7, 2 and 6, etc, provide for D directly, as set forth below:

$$\frac{S_n(G=40)}{S_m(G=40)} = \frac{S_n(G=0) e^{-\gamma^2 G^2 D 2n(\delta^3/3)}}{S_m(G=0) e^{-\gamma^2 G^2 D 2m(\delta^3/3)}} \quad (8)$$

where n and m are symmetric about the spin echo, here when $n=4$. Note from FIG. 4A, that $S_n(G=0)=S_m(G=0)$ when n and m are symmetric about the spin echo. Thus, the equation 9 above can be used to solve for D:

$$D = \frac{\ln\left(\frac{S_n(G)}{S_m(G)}\right)}{2b(m-n)} \quad (9)$$

where $b=\gamma^2 G^2(\delta^3/3)$. From these echoes of FIG. 4B, the time symmetric ratios produce directly a value for D, the diffusion constant, of about $2.08 \times 10^{-9}$ m²/s in a single-shot procedure.

The explanation above demonstrates that the diffusion constant is accurately determinable from a single-shot procedure using multiple gradient-recalled echoes. A few points should be noted. The single-shot procedure contains information not only on diffusion, but also bulk motion. Phase differences between even and odd echoes is one source of this information on bulk motion. Field inhomogeneity lead to a difference in diffusional weighting of the odd and even echoes. Using this feature, it is possible to calculate a static gradient due to the inhomogeneity. It is possible to modify the procedure for 2-dimensional and (localized) spectroscopy. In some situations, it may be necessary to separate relaxation and diffusion effects, as relaxation leads to an asymmetric echo. In this case, the relaxation must either be derived from the symmetry, or performance of a second procedure is required to take relaxation into account. It is also possible to use two RF refocussing pulses in a single scan.

In conclusion, the present invention provides a simple, efficient solution to the problem of determining diffusion constants of a body. While the above is a complete description of the preferred embodiments of the invention, various alternatives, modifications, and equivalents may be used. Therefore, the above description should not be taken as limiting the scope of the invention which is defined by the appended claims.

What is claimed is:

1. A single-shot method for obtaining magnetic resonance signals from a body, the method comprising the steps of:
   (a) applying a first radio-frequency (RF) excitation pulse to the body to tip nuclear spins;
   (b) applying, after said application of said first RF excitation pulse, a first gradient pulse to the body;
   (c) applying a second RF excitation pulse to the body;
   (d) applying, after said application of said second RF excitation pulse, a series of consecutive alternating-phase gradient pulses, each gradient pulse having an amplitude and a pulse width;
   (e) detecting a series of gradient-recalled echoes created by said series of consecutive alternating-phase gradient pulses, said series of gradient recalled echoes including a particular spin echo; and
   (f) ratioing a pair of corresponding ones of said gradient recalled echoes, with said corresponding ones of said pair of gradient recalled echoes symmetric in time with respect to said particular spin echo.

2. A single-shot method for obtaining magnetic resonance signals from a body, the method comprising the steps of:
   (a) applying a static magnetic field to the body to align nuclear spins;
   (b) applying a first radio-frequency (RF) excitation pulse to the body to tip nuclear spins;
   (c) applying, after said application of said first RF excitation pulse, a first gradient pulse to the body;
   (d) applying a second RF excitation pulse to the body;
   (e) applying, after said application of said second RF excitation pulse, a series of consecutive alternating-phase gradient pulses, each gradient pulse having an amplitude and a pulse width;
   (f) detecting a series of gradient-recalled echoes created by said series of consecutive alternating-phase gradient pulses, said series of gradient recalled echoes including a particular spin echo; and
   (g) ratioing a pair of corresponding ones of said gradient recalled echoes, with said corresponding ones of said pair of gradient recalled echoes symmetric in time with respect to said particular spin echo.

3. An apparatus for obtaining magnetic resonance signals from a body, comprising:
   (a) means for applying a first radio-frequency (RF) excitation pulse to the body to tip nuclear spins;
   (b) means for applying, after said application of said first RF excitation pulse, a first gradient pulse to the body;
   (c) means for applying a second RF excitation pulse to the body;
   (d) means for applying, after said application of said second RF excitation pulse, a series of consecutive alternating-phase gradient pulses, each gradient pulse having an amplitude and a pulse width;
   (e) means for detecting a series of gradient-recalled echoes created by said series of consecutive alternating-phase gradient pulses, said series of gradient recalled echoes including a particular spin echo; and (f) means for ratioing a pair of corresponding ones of said gradient recalled echoes, with said corresponding ones of said pair of gradient recalled echoes symmetric in time with respect to said particular spin echo.

4. An apparatus for obtaining magnetic resonance signals from a body, comprising:
(a) means for applying a static magnetic field to the body to align nuclear spins;
(b) means for applying a first radio-frequency (RF) excitation pulse to the body to tip nuclear spins;
(c) means for applying, after said application of said first RF excitation pulse, a first gradient pulse to the body;
(d) means for applying a second RF excitation pulse to the body;
(e) means for applying, after said application of said second RF excitation pulse, a series of consecutive alternating-phase gradient pulses, each gradient pulse having an amplitude and a pulse width;
(f) means for detecting a series of gradient-recalled echoes created by said series of consecutive alternating-phase gradient pulses, said series of gradient recalled echoes including a particular spin echo; and
(g) means for ratioing a pair of corresponding ones of said gradient recalled echoes, with said corresponding ones of said pair of gradient recalled echoes symmetric in time with respect to said particular spin echo.

5. A single-shot method for obtaining magnetic resonance signals from a body, the method comprising the steps of:
(a) applying a first radio-frequency (RF) excitation pulse to the body to tip nuclear spins;
(b) applying, after said application of said first RF excitation pulse, a first gradient pulse to the body;
(c) applying a second RF excitation pulse to the body;
(d) applying, after said application of said second RF excitation pulse, a series of consecutive alternating-phase gradient pulses, each gradient pulse having an amplitude and a pulse width;
(e) detecting both an amplitude of and a relative phase between each echo of a series of gradient-recalled echoes created by said series of consecutive alternating-phase gradient pulses, said series of gradient recalled echoes including a particular spin echo; and
(f) extracting diffusion information out of ratios of pairs of corresponding ones of said gradient recalled echoes, with said corresponding ones of said pair of gradient recalled echoes symmetric in time with respect to said particular spin echo.

6. A single-shot method for obtaining magnetic resonance signals from a body, the method comprising the steps of:

(a) applying a first radio-frequency (RF) excitation pulse to the body to tip nuclear spins;
(b) applying, after said application of said first RF excitation pulse, a first gradient pulse to the body;
(c) applying a second RF excitation pulse to the body;
(d) applying, after said application of said second RF excitation pulse, a series of consecutive alternating-phase gradient pulses, each gradient pulse having an amplitude and a pulse width;
(e) detecting both an amplitude of and a relative phase between each echo of a series of gradient-recalled echoes created by said series of consecutive alternating-phase gradient pulses, said series of gradient recalled echoes including a particular spin echo;
(f) extracting diffusion information from the body by ratioing pairs of corresponding ones of said gradient recalled echoes, with said corresponding ones of said pair of gradient recalled echoes symmetric in time with respect to said particular spin echo; and
(g) extracting flow information from the body by measuring said relative phase between successive echoes of said series of gradient recalled echoes.

7. The single shot method of claim 6 further comprising the step of:
removing said diffusion information from said flow information.

8. An apparatus for obtaining magnetic resonance signals from a body, comprising:
(a) means for applying a first radio-frequency (RF) excitation pulse to the body to tip nuclear spins;
(b) means for applying, after said application of said first RF excitation pulse, a first gradient pulse to the body;
(c) means for applying a second RF excitation pulse to the body;
(d) means for applying, after said application of said second RF excitation pulse, a series of consecutive alternating-phase gradient pulses, each gradient pulse having an amplitude and a pulse width;
(e) means for detecting both an amplitude of and a relative phase between echoes of a series of gradient-recalled echoes created by said series of consecutive alternating-phase gradient pulses, said series of gradient recalled echoes including a particular spin echo; and
(f) means for extracting diffusion information by ratioing pairs of corresponding ones of said gradient recalled echoes, with said corresponding ones of said pair of gradient recalled echoes symmetric in time with respect to said particular spin echo.

9. The apparatus of claim 8 further comprising:
(g) means for extracting flow information from said relative phase of said series of gradient recalled echoes.

10. The apparatus of claim 9 further comprising:
(h) means for removing said diffusion information from said flow information.

* * * * *